(12) United States Patent
Yang et al.

(10) Patent No.: US 8,759,693 B2
(45) Date of Patent: Jun. 24, 2014

(54) ENCLOSURE WITH SHIELD APPARATUS

(75) Inventors: Cheng-Hsiu Yang, New Taipei (TW); Po-Chuan Hsieh, New Taipai (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/602,337

(22) Filed: Sep. 4, 2012

(65) Prior Publication Data
US 2014/0060914 A1    Mar. 6, 2014

(30) Foreign Application Priority Data
Aug. 29, 2012    (TW) .............................. 101131328 A

(51) Int. Cl.
*H05K 9/00*    (2006.01)
*H02B 1/56*    (2006.01)

(52) U.S. Cl.
USPC .......................................... 174/383; 454/184

(58) Field of Classification Search
USPC ............................ 174/383; 454/184; 361/818
See application file for complete search history.

(56) References Cited

U.S. PATENT DOCUMENTS

| | | | | |
|---|---|---|---|---|
| 5,698,818 A | * | 12/1997 | Brench ......................... | 174/385 |
| 6,297,446 B1 | * | 10/2001 | Cherniski et al. ............. | 174/383 |
| 6,384,325 B1 | * | 5/2002 | Chastain et al. .............. | 174/383 |
| 7,390,976 B2 | * | 6/2008 | Liang et al. .................... | 174/383 |
| 7,492,610 B2 | * | 2/2009 | Gilliland ........................ | 361/818 |
| 8,502,087 B2 | * | 8/2013 | Medrano et al. .............. | 174/383 |
| 2006/0148398 A1 | * | 7/2006 | Ruch et al. .................... | 454/184 |
| 2011/0297413 A1 | * | 12/2011 | Liu et al. ......................... | 174/50 |
| 2011/0298341 A1 | * | 12/2011 | Liu et al. .................... | 312/223.1 |
| 2013/0175082 A1 | * | 7/2013 | Kim et al. ..................... | 174/383 |

* cited by examiner

*Primary Examiner* — Hung Ngo
(74) *Attorney, Agent, or Firm* — Novak Druce Connolly Bove + Quigg LLP

(57) ABSTRACT

An enclosure includes a sidewall defining a number of first vents and a shield apparatus installed to the sidewall. The shield apparatus includes a shield plate spaced from the sidewall. A distance between the sidewall and the shield plate is greater than a size of the first vent. The shield plate defines a number of second vents respectively aligning with the first vents.

11 Claims, 5 Drawing Sheets

ENCLOSURE WITH SHIELD APPARATUS

BACKGROUND

1. Technical Field

The present disclosure relates to enclosures and, particularly, to an enclosure with a shield apparatus.

2. Description of Related Art

In an electronic device, such as a server or a computer, electromagnetic interference (EMI) is a common problem during operation of the electronic device. Commonly, a plurality of vents is defined in the enclosure for heat dissipation, and the sizes and placement of the vents are chosen and arranged to help avoid EMI. However, the vents with small sizes are not circulative enough to dissipate the heat of the enclosure, while the vents with large sizes are not shielding enough to avoid EMI.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
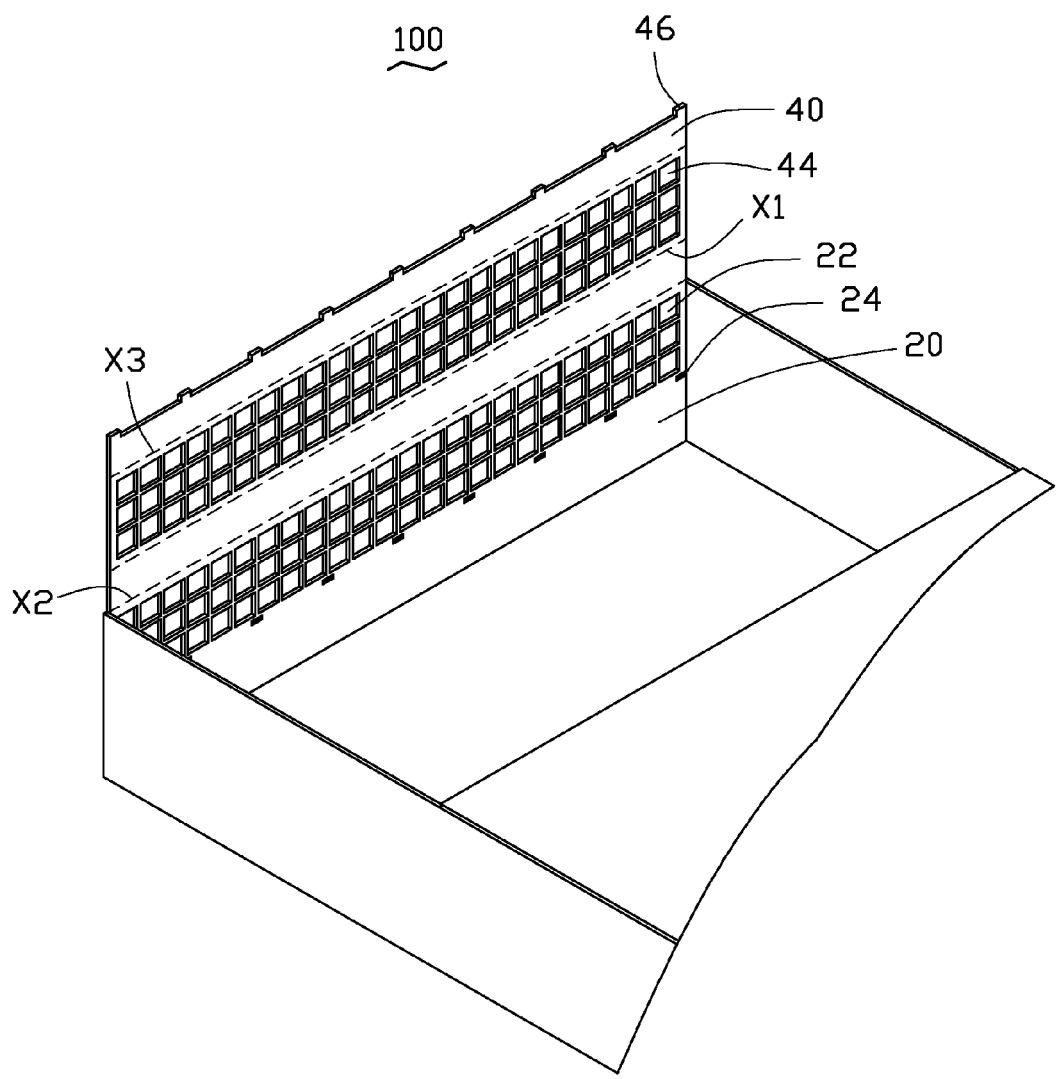
FIG. 1 is an exploded, isometric view of a first embodiment of an enclosure, wherein the enclosure includes a shield apparatus.
Figure 2:
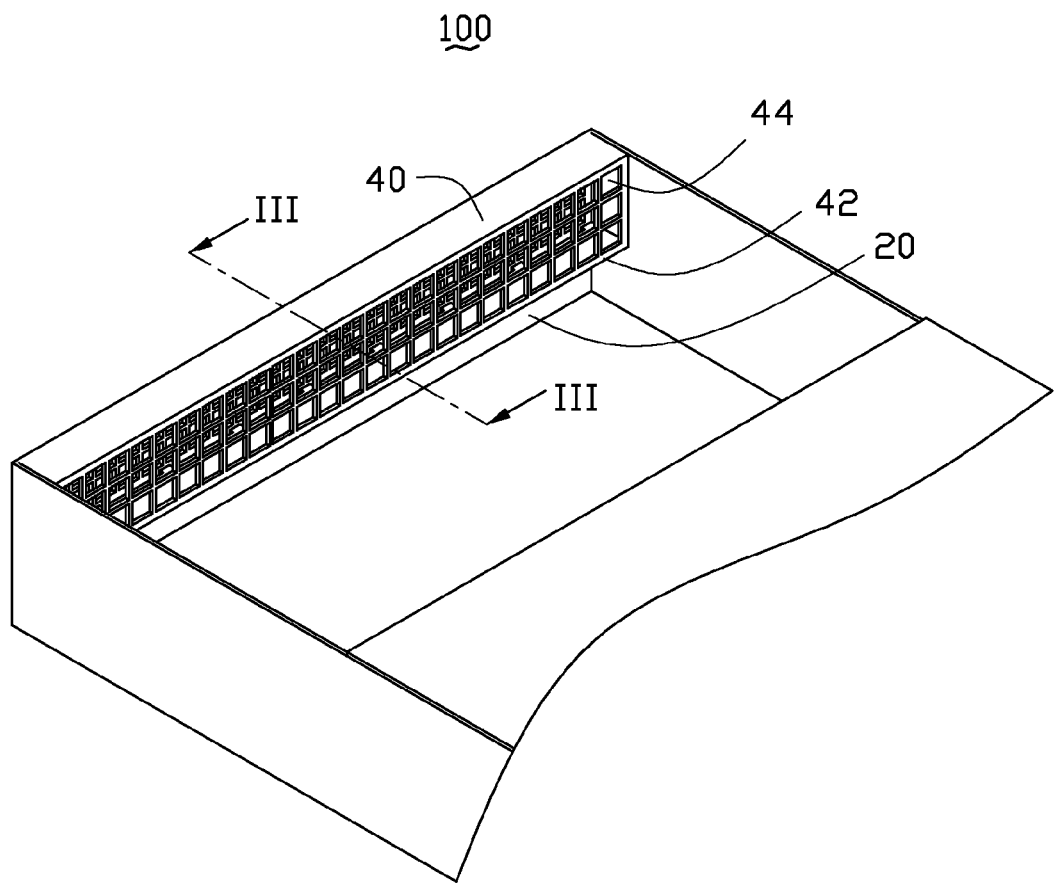
FIG. 2 is an assembled, isometric view of FIG. 1.

Referring to FIG. 1 and FIG. 2, a first embodiment of an enclosure 100 of an electronic device includes a rectangular sidewall 20 and a shield apparatus 40 located above the sidewall 20. The sidewall 20 and the shield apparatus 40 are integrally formed and coplanar with each other.

The sidewall 20 defines a plurality of first vents 22, and a plurality of fastening holes 24 below the first vents 22. The shield apparatus 40 defines a plurality of second vents 44. A plurality of pieces 46 protrudes out from a top side of the shield apparatus 40 away from the enclosure 100. Two parallel first bending lines X1 and X2 are formed between the first vents 22 and the second vents 44, and a second bending line X3 is formed above the second vents 44 and below the pieces 46. A distance between the first bending lines X1 and X2 is greater than the side length of the first vent 22. In the embodiment, each first vent 22 is square, each second vent 44 is square, a side length of the first vent 22 is equal to a side length of the second vent 44, and the side length of each first and second vent 22 and 44 is about 4 millimeters (mm) to about 8 mm.

In assembly, the shield apparatus 40 is perpendicularly bent along the first and second bending lines X1, X2, and X3, the pieces 46 are respectively latched into the fastening holes 24, and the second vents 44 are respectively aligned with the first vents 22. The sidewall 20 and the shield apparatus 40 cooperatively bound a shield space 48. In the embodiment, the distance between the sidewall 20 and the shield plate 42 is about 10 mm.

Figure 3:
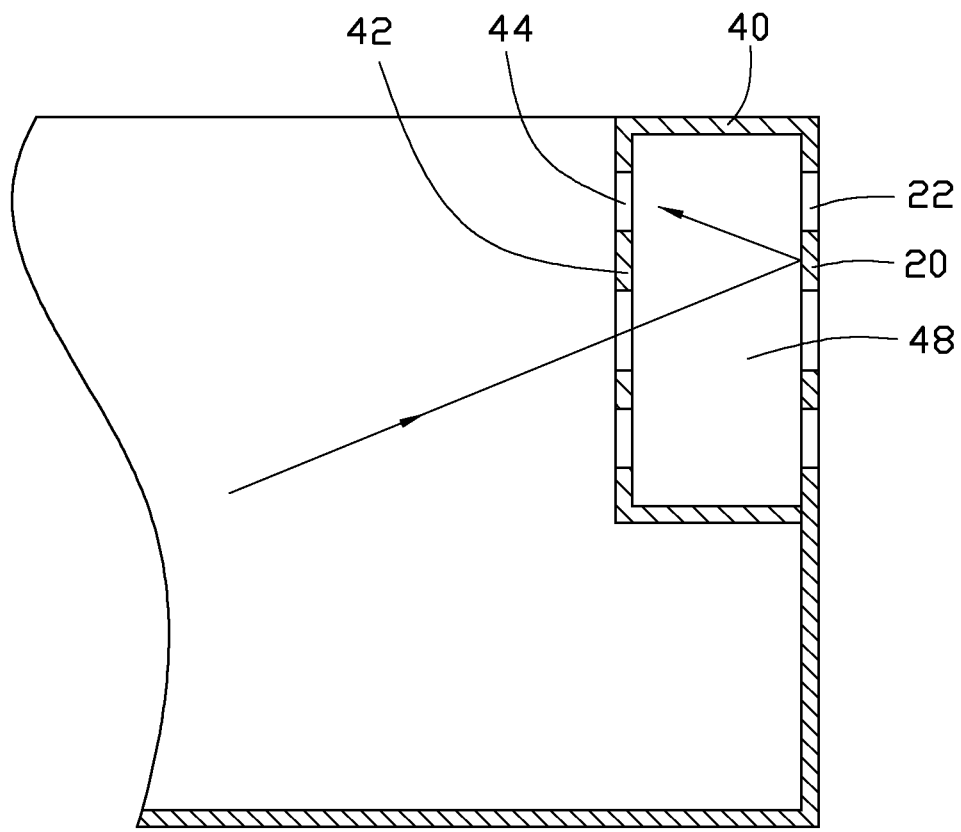
FIG. 3 is a cross-sectional view of FIG. 2, taken along the line of III-III.

Referring to FIG. 3, when the electronic device operates, heat and electromagnetic radiation are generated by the electronic device. The heat is dissipated out of the enclosure 100 through the second vents 44 and the first vents 22. Some of the electromagnetic radiation extends through the second vents 44, and is reflected back by the sidewall 20 for preventing the electromagnetic radiations from leaking out of the enclosure 100.

Figure 4:
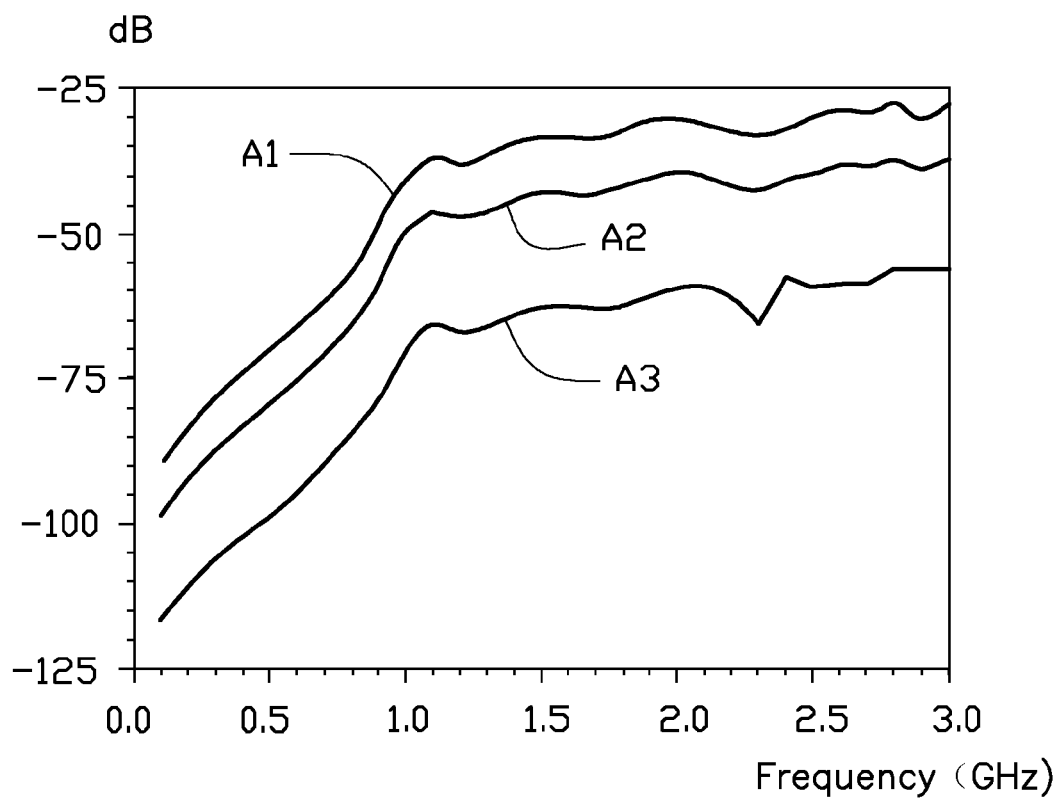
FIG. 4 is a graph showing electromagnetic interference shielding effectiveness of a conventional enclosure and the enclosure using the shield apparatus of FIG. 1.

Referring to FIG. 4, a curve A1 represents electromagnetic interference (EMI) shielding effectiveness of a conventional enclosure, and the size of each vent of the conventional enclosure is 6 mm*6 mm. A curve A2 represents EMI shielding effectiveness of another conventional enclosure, and the size of each vent of the conventional enclosure is 4 mm*4 mm. A curve A3 represents EMI shielding effectiveness of the enclosure 100 with the shield apparatus 40 of FIG. 1, and the size of each of the first and second vents 22 and 44 is 6 mm*6 mm. FIG. 4 clearly indicates that the EMI shielding effectiveness of the enclosure 100 with the shield apparatus 40 is better than the EMI shielding effectiveness of the conventional enclosure.

Figure 5:
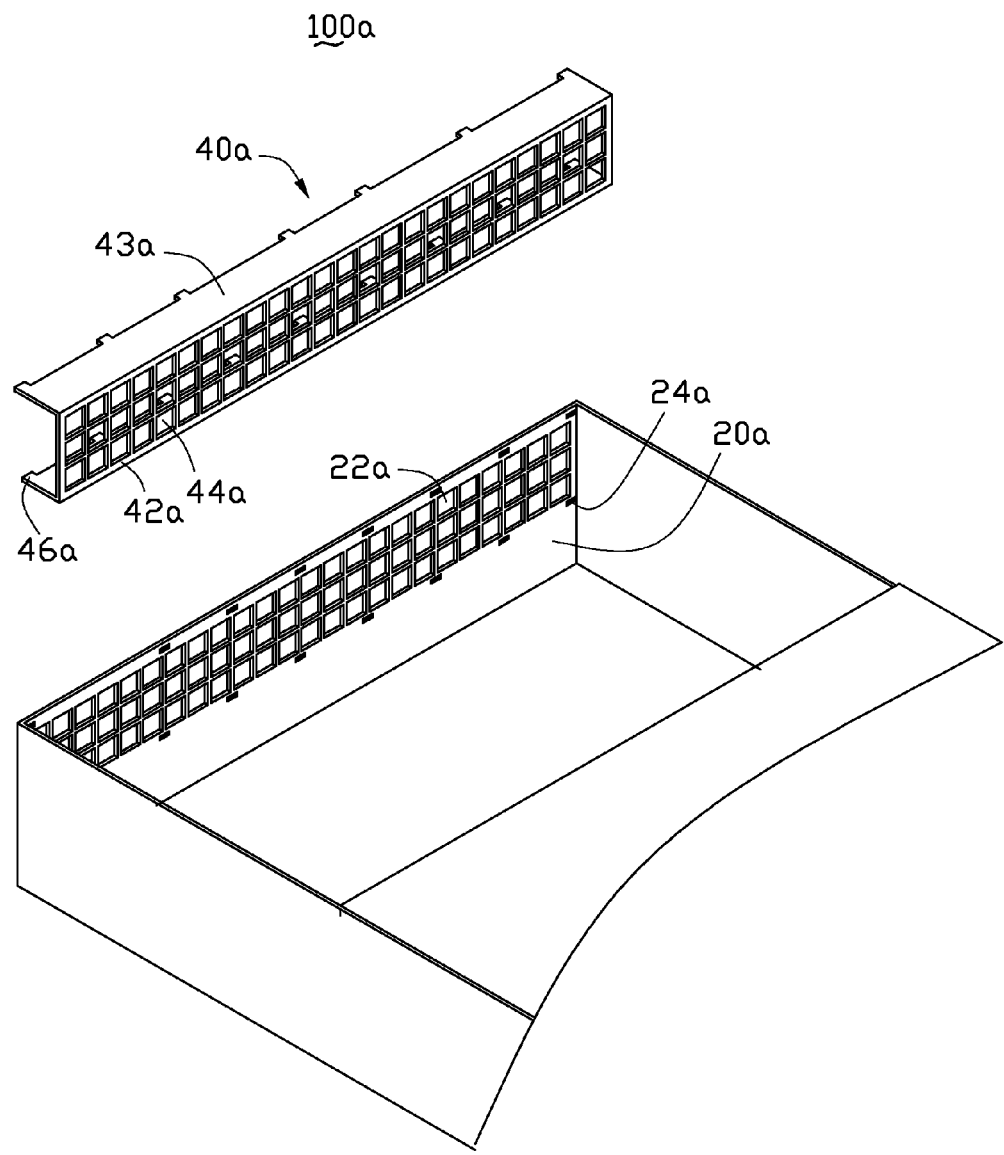
FIG. 5 is an isometric view of a second embodiment of an enclosure.

Referring to FIG. 5, a second embodiment of an enclosure 100a is substantially similar to the first embodiment of the enclosure 100, except that the enclosure 100a includes a rectangular sidewall 20a and a shield apparatus 40a. The sidewall 20a defines a plurality of first vents 22a. A plurality of fastening holes 24a is defined in the sidewall 20a, respectively above and below the first vents 22a. The shield apparatus 40a includes a rectangular shield plate 42a and two connecting plates 43a perpendicularly extending out from top and bottom sides of the shield plate 42a. The shield plate 42a defines a plurality of second vents 44a. A plurality of pieces 46a protrudes out from a side of each connecting plate 43a away form the shield plate 42a, arrayed along a lengthwise direction of the connecting plate 43a. In assembly, the pieces 46a of the shield apparatus 40a are latched into the fastening holes 24a of the sidewall 20a from an inner side of the sidewall 20a, to allow the second vents 44a to respectively align with the first vents 22a. A distance between the sidewall 20a and the shield plate 42a is greater than the side length of the first vents 22a.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. An enclosure, comprising:
   a sidewall defining a plurality of first vents; and
   a shield apparatus installed to the sidewall, and comprising a shield plate spaced from the sidewall;
   wherein a distance between the sidewall and the shield plate is greater than a size of each first vent, and the shield plate defines a plurality of second vents respectively aligning with the first vents; and wherein the sidewall and the shield apparatus are integrally formed and coplanar with each other, two parallel first bending lines are formed between the first vents and the second vents, and a second bending line is formed above the second vents, the shield apparatus is bent along the first and second bending lines.

2. The enclosure of claim 1, wherein a distance between the first bending lines is greater than the side length of the first vent.

3. The enclosure of claim 1, wherein a plurality of fastening holes is defined in the sidewall below the first vents, a plurality of pieces protrudes out from a top side of the shield apparatus away from the sidewall, the pieces are respectively latched into the fastening holes.

4. The enclosure of claim 1, wherein the shield plate is rectangular, two connecting plates extend out from top and bottom sides of the shield plate, to be installed to the sidewall, wherein the sidewall, the shield plate, and the connecting plates cooperatively bound a shield space.

5. The enclosure of claim 4, wherein a plurality of fastening holes is defined in the sidewall, respective above and below the first vents, a plurality of pieces protrudes out from each connecting plate and is respectively latched into the fastening holes.

6. The enclosure of claim 1, wherein the shield plate is located at an inner side of the sidewall.

7. The enclosure of claim 1, wherein each first vent is square, and a side length of the first vent is about 4 millimeters (mm) to about 8 mm.

8. The enclosure of claim 1, wherein each second vent is square, and a side length of the second vent is about 4 mm to about 8 mm.

9. The enclosure of claim 1, wherein a size of each first vent is equal to a size of each second vent.

10. An enclosure, comprising:
a sidewall defining a plurality of first vents; and
a shield apparatus installed to the sidewall, and comprising a shield plate spaced from the sidewall;
wherein a distance between the sidewall and the shield plate is greater than a size of each first vent, and the shield plate defines a plurality of second vents respectively aligning with the first vents; and
wherein the shield plate is rectangular, two connecting plates extend out from top and bottom sides of the shield plate, to be installed to the sidewall, and wherein the sidewall, the shield plate, and the connecting plates cooperatively bound a shield space.

11. The enclosure of claim 10, wherein a plurality of fastening holes is defined in the sidewall, respective above and below the first vents, a plurality of pieces protrudes out from each connecting plate and is respectively latched into the fastening holes.

\* \* \* \* \*